United States Patent [19]

Yamada et al.

[11] Patent Number: 5,198,262

[45] Date of Patent: Mar. 30, 1993

[54] METHOD OF FORMING MIRROR FOR ELECTROMAGNETIC RADIATIONS OF SHORT WAVELENGTHS

[75] Inventors: Isao Yamada, Kyoto; Yoichi Hashimoto, Hyogo, both of Japan

[73] Assignee: Mitsubishi Denki Kabushiki Kaisha, Tokyo, Japan

[21] Appl. No.: 669,536

[22] Filed: Mar. 14, 1991

[30] Foreign Application Priority Data

Mar. 16, 1990 [JP] Japan .................................. 2-66298

[51] Int. Cl.⁵ .......................... B05D 3/06; G21K 7/00
[52] U.S. Cl. .................................. 427/527; 427/125; 427/250; 427/165; 427/166; 427/314; 427/531; 378/70
[58] Field of Search ................ 427/38, 35, 165, 166, 427/250, 314, 125; 378/70, 43; 350/320; 428/434

[56] References Cited

U.S. PATENT DOCUMENTS

| | | | |
|---|---|---|---|
| 4,091,138 | 5/1978 | Takagi et al. | 428/209 |
| 4,152,478 | 5/1979 | Takagi | 428/221 |
| 4,811,690 | 3/1989 | Kawagoe et al. | 118/723 |
| 4,924,490 | 5/1990 | Hashimoto et al. | 378/145 |
| 4,959,242 | 9/1990 | Itoh | 427/38 |

OTHER PUBLICATIONS

"X-Ray Optical Elements and Their Applications" by Sadao Aoki, in *Applied Physics*, vol. 56 pp. 342-351, 1986.

"Vacuum Deposition" by Yamamoto in Metal Surface Technology, vol. 30, No. 5, 1979, pp. 225-231.

"Reflectance of X-Ray Mirrors from 3.8 to 50 keV (3.3 to 0.25A)" D. H. Bilderback-SPIE vol. 315 (1981) pp. 90-102.

*Primary Examiner*—Shrive Beck
*Assistant Examiner*—Roy V. King

[57] ABSTRACT

Disclosed herein is a method of producing a mirror for electromagnetic radiations of short wavelengths, the method including forming a film on a substrate having a surface roughness smaller than 5 Å by bombardment with a metal, which is at least partly in the form of cluster ions, in a vacuum chamber under the conditions that the accelerating voltage applied to the accelerating electrode is of 3-7 kV, the temperature of the substrate is kept at 0°-60° C., the pressure in the vacuum chamber is kept below $1 \times 10^{-7}$ Torr, and the film is formed at a rate of 0.5-5 Å/s until it becomes 50-1000 Å thick. A mirror form in accordance with this method has a high reflectivity which has never been achieved by conventional methods.

7 Claims, 6 Drawing Sheets

METHOD OF FORMING MIRROR FOR ELECTROMAGNETIC RADIATIONS OF SHORT WAVELENGTHS

BACKGROUND OF THE INVENTION

1. Field of the Invention

The present invention relates to a method of producing a mirror for electromagnetic radiations of short wavelengths such as ultraviolet rays, soft X-rays, or X-rays, the mirror being used for an excimer laser generator and laser machining apparatus, X-ray microscope, X-ray telescope, or SR (synchrotron radiation) facility.

2. Description of the Prior Art

An X-ray microscope is provided with an X-ray mirror which needs to meet stringent specifications. X-ray mirrors in general use are manufactured by deposition of gold (Au) or platinum (Pt) on a substrate of artificial quartz or silicon carbide film formed by chemical vapor deposition. A mirror to reflect electromagnetic radiations of short wavelengths such as X-rays is based on the following two principles which are mentioned in SPIE vol. 315, p. 90–102, by D. H. Biderback, and Ouyo Butsuri (Applied Physics) vol. 56, No. 3, p. 342–351, by Aoki.

(i) Reflection of X-rays is by total reflection, which takes place when the oblique incident angle with respect to the mirror surface is smaller than the critical angle ($\theta_c$) given by the equation (1) below.

$$\theta_c = 1.64 \times 10^{-3} \sqrt{\rho \cdot \lambda} \text{(rad)} \quad (1)$$

$\rho$: density of mirror substance (g/cc)
$\lambda$: wavelength of X-ray (Å)

It is apparent from the equation (1) that the higher the density ($\rho$), the greater the critical angle ($\theta_c$) for a given wavelength ($\lambda$) of X-ray. For example, Au has a critical angle ($\theta_c$) of approximately 3.2 for an incident X-ray having a wavelength of 8 Å. Therefore, Au finds practical use.

(ii) Reflectivity (R) of X-rays depends on the surface roughness of the mirror as indicated by the equation (2) below.

$$R = R_0 \exp[-4\pi\sigma \sin\theta/\lambda)^2] \quad (2)$$

$R_0$: Reflectivity of an ideal mirror having a surface roughness of 0 Å
$\sigma$: surface roughness (Å)
$\theta$: oblique incident angle of X-ray (rad)
$\lambda$: wavelength of X-ray (Å)

The equation (2) indicates that the surface roughness $\sigma$ should be as small as possible for a given wavelength ($\lambda$) and incident angle $\theta$). In the case of X-rays, the value of $\sigma$ should be smaller than 5 Å for practical use.

It goes without saying that the foregoing argument can be applied also to soft X-rays and ultraviolet rays having longer wavelengths than X-rays.

The X-ray mirror based on the above-mentioned theory is produced by the conventional method explained in the following.

FIG. 6 shows a vacuum deposition apparatus cited from Kinzoku Hyomen Gijutsu (Metal Surface Technology), 1979, vol. 30, No. 5, p. 11. In the figure, there is shown a deposit material (Au) I, a glass substrate 2, an Au film 3 formed on the glass substrate 2, a crucible 4, a crucible heater 5, an evacuation system 6, a rotary shutter 9, a substrate holder 10 with a cooling mechanism, a vacuum chamber 11, and a power supply 12.

The apparatus shown in FIG. 6 is operated in the following manner to form the Au film 3 on the glass substrate 2. First, the glass substrate 2 and the crucible 4 containing the deposit material I are arranged in the vacuum chamber 11. The vacuum chamber 11 is evacuated by the evacuation system 6, so that the pressure in the vacuum chamber 11 is reduced to about $10^{-6}$ Torr. The crucible 4 is heated by means of the heater 5 connected to the power supply 12, so that the deposit material (Au) reaches about 1500° C. at which Au has a vapor pressure of 0.1 to 1 Torr. With the deposit material heated, the shutter 9 is opened so that Au vapor condenses on the glass substrate 2 positioned above the crucible 4. During deposition, the substrate is usually kept lower than room temperature by passing water through the substrate holder 10 in order to prevent the Au film from becoming rough (presumably due to recrystallization) while it is being formed. When the Au film 3 has reached a desired thickness (usually 500–1000 Å, the shutter 9 is closed. The film thickness is usually measured with a thickness gauge of quartz oscillator type (not shown). This is the conventional method of producing a mirror.

Incidentally, it may be conceivable to use Au or Pt in bulk superfinished by a method of float polishing in place of an Au or Pt in film deposited on a substrate, if it is a sole object to obtain a high reflectivity.

The production of mirrors by the above-mentioned vacuum deposition apparatus has a disadvantage that adhesion of the Au film 3 to the glass substrate 2 is too low to make the mirror reliable for practical use. (The Au film is peeled off by a piece of adhesive tape.) This occurs if vacuum deposition is performed when the glass substrate 2 is not completely cleaned, because the deposit material 1 is given only a small amount of energy (approximately 0.1 eV) at the time of deposition. For improved adhesion, it is desirable to keep the glass substrate 2 at a high temperature; but this gives rise to an Au film having a rough surface which increases scattering. This is in contradiction to the above-mentioned requirement (i). On the other hand, vacuum deposition performed with the glass substrate 2 kept at a low temperature gives rise to an Au film having a low density. This is in contradiction to the above-mentioned requirement (ii). The glass substrate 2 held at a low temperature does not permit Au atoms striking the substrate to move to the stable lattice position, but permits Au atoms to form a film at the spot which they strike. The Au film thus formed has a low density and hence has a small critical angle for total reflection.

A mirror formed by polishing Au or Pt in bulk has the surface structure as shown in FIG. 7 which contributes to total reflection. The surface structure consists of crystal grains 13 and affected layers 14. In the case of a mirror of this type, it is difficult to reduce the surface roughness below 50 Å even by the float polishing which produces the flattest surface available at the present time. This is because the working efficiency differs depending on the orientation of crystal grains. Moreover, it is impossible to completely eliminate the affected layer. As a result, the outermost surface layer of about 10 Å thick (2- to 3-atom layer) contains residual abrasive grains used for float polishing and also has lattice strains remaining in the bulk surface. In addition, Au and Pt are too expensive to be used in bulk as a mirror.

SUMMARY OF THE INVENTION

The present invention was considered to address the above-mentioned problems. Accordingly, it is an object of the present invention to provide a method of economically producing a mirror for electromagnetic radiations of short wavelengths which has as high a reflectivity as the theoretical value, with the reflecting layer having a practically high level of adhesion.

The gist of the present invention resides in a method of producing a mirror for electromagnetic radiations of short wavelengths, the method including forming a film on a substrate having a surface roughness smaller than 5 Å by bombardment with a metal, which is at least partly in the form of cluster ions, in a vacuum chamber under the conditions that the accelerating voltage applied to the accelerating electrode is of 3-7 kV, the temperature of the substrate is kept at 0°-60° C., the pressure in the vacuum chamber is kept below $1 \times 10^{-7}$ Torr, and the film is formed at a rate of 0.5-5 Å/s until it becomes 50-1000 Å thick.

According to the present invention, the bombardment for film formation is performed under the specific conditions of accelerating voltage, film forming rate, substrate temperature, and vacuum, which control the amount of charge reaching the substrate and generate particles in the form of cluster ions which have both kinetic energy and electric charges. With the method of the present invention, it is possible to form a film having an optimum surface roughness, density, and adhesion strength, which lead to the sophisticated optical characteristics required of a mirror for electromagnetic radiations of short wavelengths.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention and wherein.

DESCRIPTION OF THE PREFERRED EMBODIMENT

Figure 1:
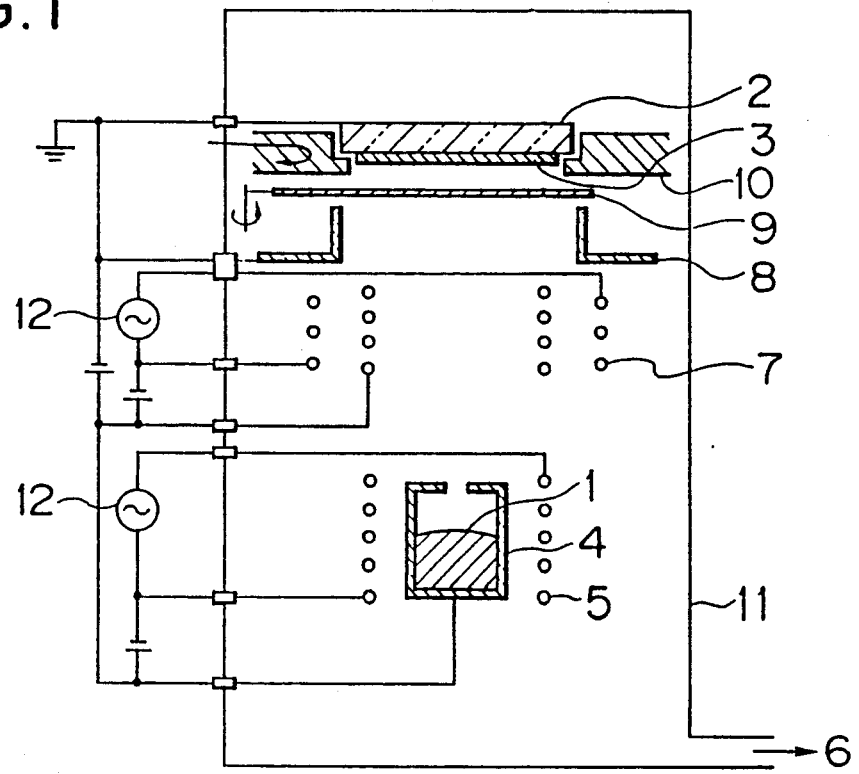
FIG. 1 is a schematic diagram showing the structure of a vacuum deposition apparatus used to produce a mirror according to an embodiment of the present invention.
Figure 6:
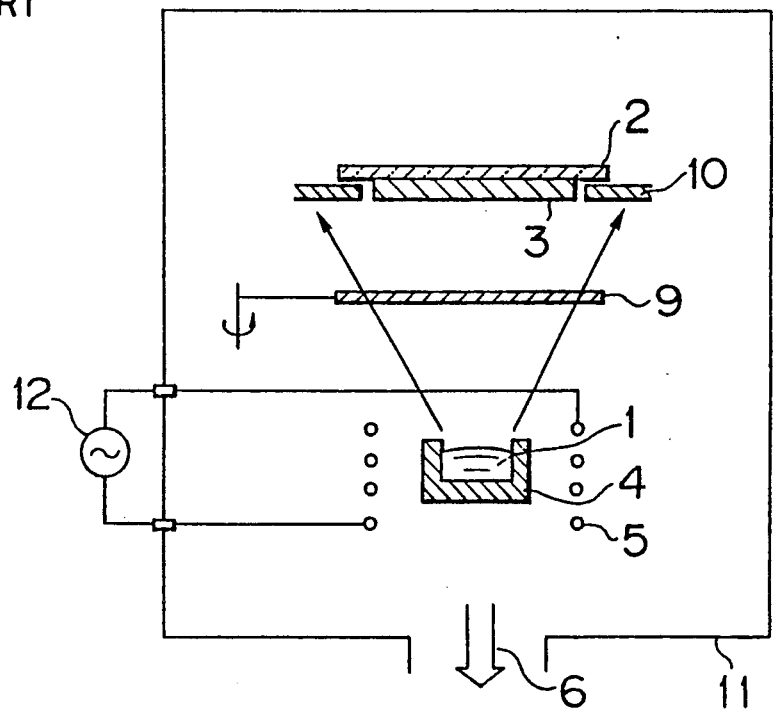
FIG. 6 is a schematic diagram showing the structure of a vacuum deposition apparatus used to form a film by the conventional method.
Figure 7:
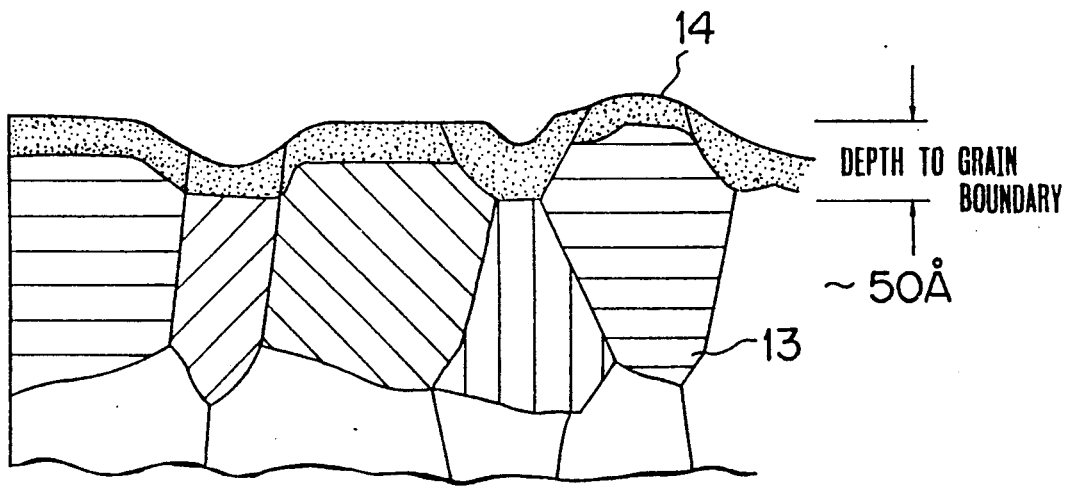
FIG. 7 is a schematic sectional view showing how the conventional method affects the structure of the outermost surface of Au or Pt in bulk.

An embodiment of the present invention will be explained with reference to the accompanying drawings. In FIG. 1, there is shown an electron source 7 for generating cluster ions and an accelerating electrode 8 for accelerating cluster ions, (which are characteristic of the cluster ion beam deposition apparatus). There is also shown a crucible 4 of closed structure having a small hole about 1 mm in diameter. The closed structure produces a pressure difference inside and outside the crucible, so that the deposit material 1 becomes clusters (each consisting of 500-2000 atoms). Incidentally, like reference characters designate like or corresponding parts in FIGS. 1 and 6.

The cluster ion beam deposition apparatus mentioned above is operated in the following manner using a deposit material 1 of Au and a substrate 2 of SiO$_2$ (glass) to make a mirror for electromagnetic radiations of short wavelengths. First, the substrate 2 and the crucible 4 containing the deposit material 1 (Au) are arranged in the vacuum chamber 11, which is subsequently evacuated by the evacuation system 6, so that the pressure in the vacuum chamber 11 is reduced to about $10^{-9}$ Torr. The crucible 4 is heated by means of the heater 5. When the vapor pressure of Au in the crucible 4 reaches about 1 Torr, Au vapor blows off through the small hole at the top of the crucible 4. The Au vapor undergoes adiabatic expansion, forming clusters, each consisting of 500-2000 atoms, on account of the pressure difference inside and outside the crucible 4. The clusters are exposed to the electron shower generated by the electron source 7, so that the clusters are ionized. The ionized Au clusters are given kinetic energy by the accelerating electrode 8 and are caused to strike the substrate 2, forming an Au film. Clusters which are not ionized and are hence neutral also take part in film formation because they gain a certain amount of kinetic energy (about 120 eV) when they blow out from the crucible 4.

Experimental results indicate that the above-mentioned basic requirements (i) and (ii) are decisively affected by the accelerating voltage and substrate temperature and other factors as mentioned in the following.

(A) Cluster Accelerating Voltage

Figure 2:
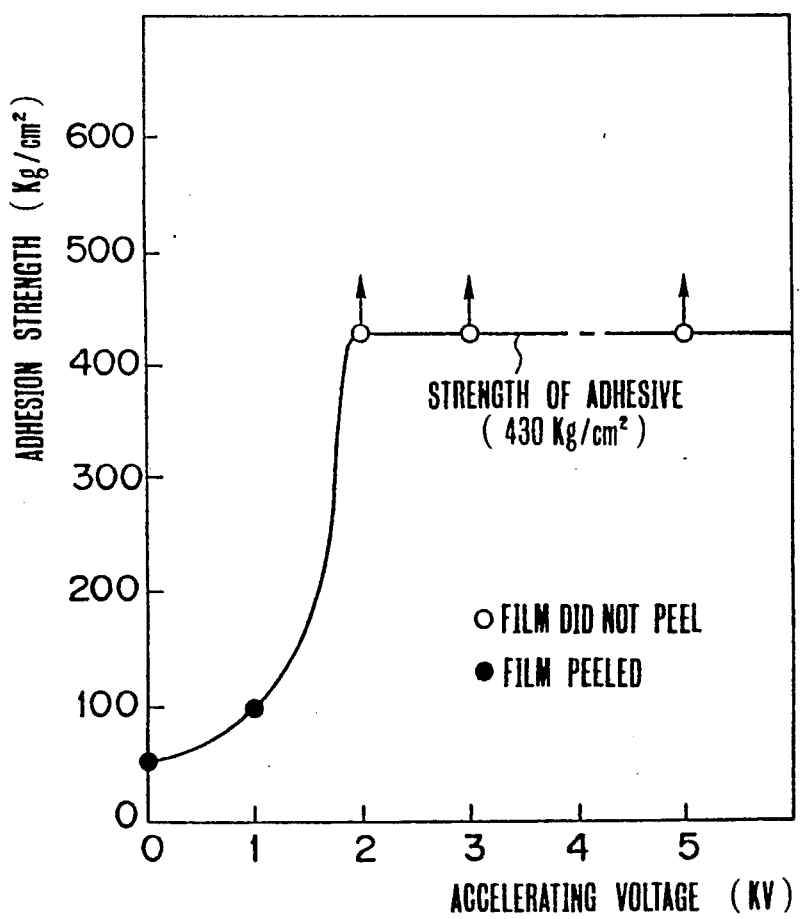
FIG. 2 is a graph showing the relationship between the accelerating voltage and adhesion strength which was observed in the production of a mirror according to the present invention.
Figure 3:
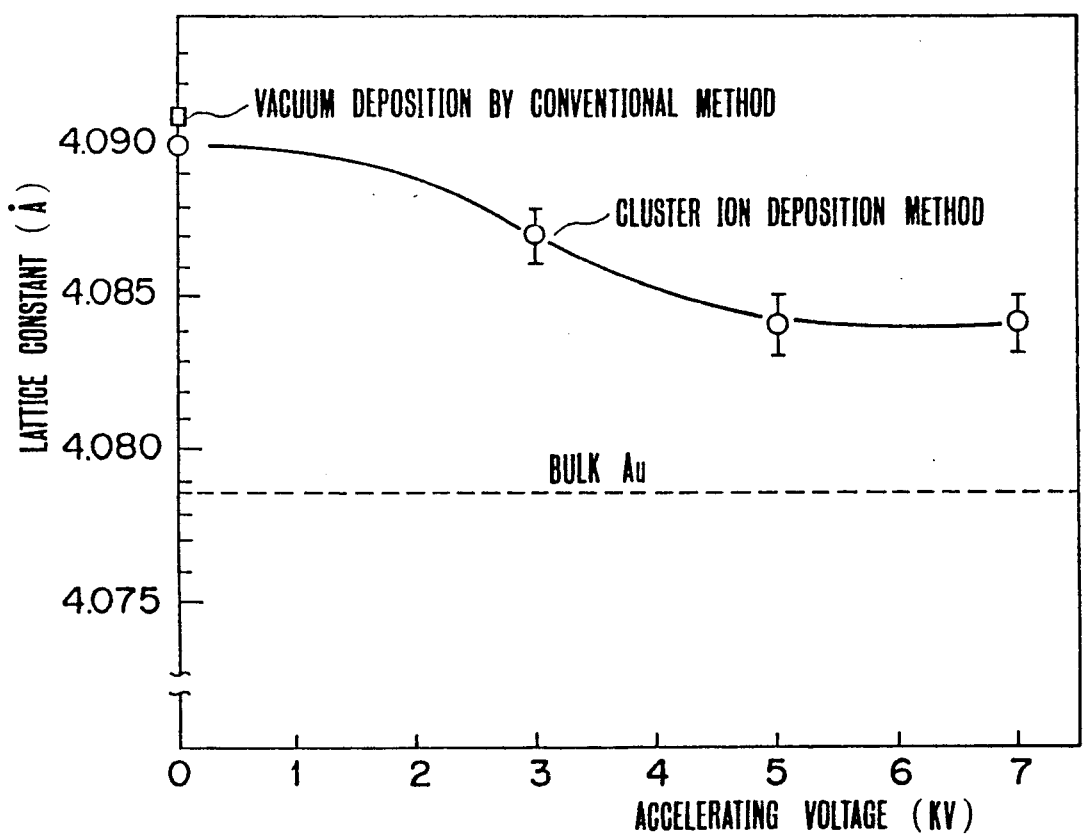
FIG. 3 is a graph showing the relationship between the accelerating voltage and lattice constant which was observed in the production of a mirror according to the present invention.
Figure 4A:
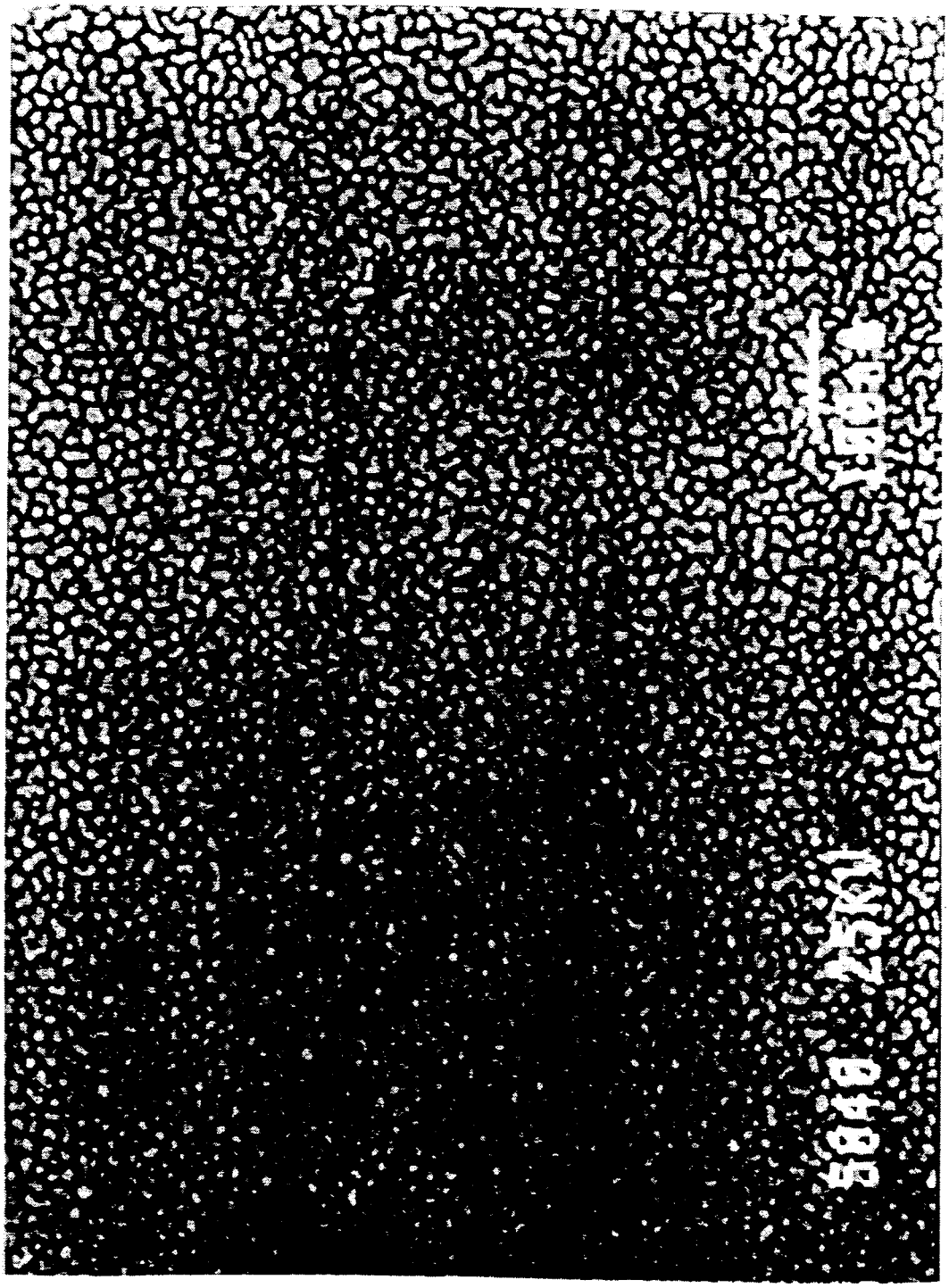
FIGS. 4(a) and 4(b) are electron micrographs showing the initial stage of film formation according to the method of the present invention and the conventional method.
Figure 4B:
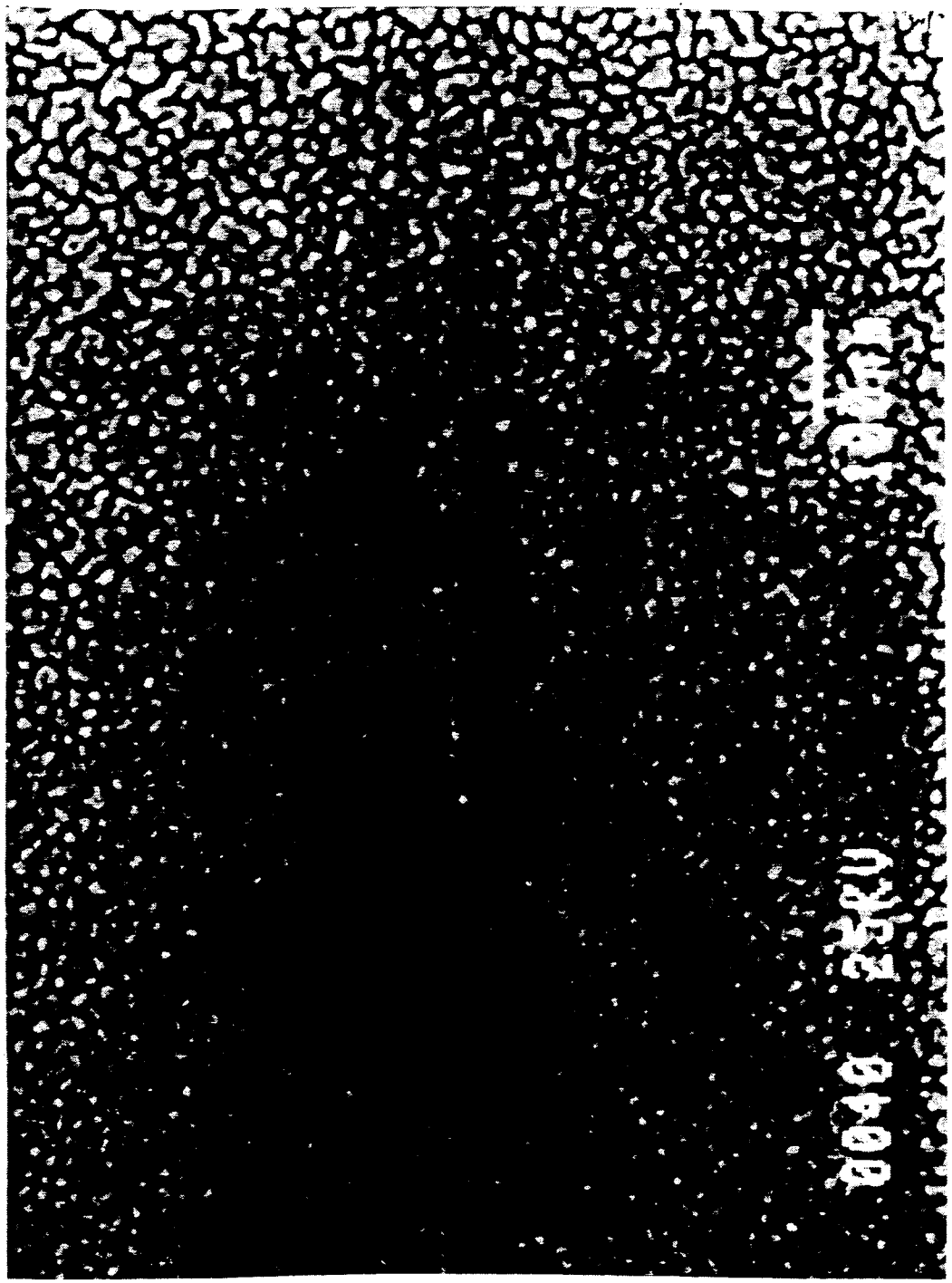

With an accelerating voltage lower than 2 kV, the resulting Au film 3 has a low adhesion strength and a low density (had hence has a small critical angle $\theta_c$ according to the equation (1) above) In this connection, FIG. 2 shows the relationship between the accelerating voltage and the adhesion strength of Au film. It is noted that when the accelerating voltage is higher than 2 kV, the adhesion strength is greater than 400 kg/cm$^2$ (which is the adhesion strength of commercial adhesives). FIG. 3 shows the dependence of the Au lattice constant on the accelerating voltage. It is noted that the Au film becomes denser (in terms of atomic level) with the increasing accelerating voltage. FIGS. 4(a) and 4(b) are electron micrographs showing the initial stage of Au film formation. They apparently indicate that the application of accelerating voltage increases the density of film-forming nuclei, contributing to the high density and high adhesion strength of the Au film. FIG. 4(a) shows the result obtained by the cluster ion beam deposition method pertaining to the present invention FIG. 4(b) shows the results obtained by the conventional vacuum deposition method. Conversely, with an acceleration voltage higher than 7 kV, the resulting Au film 3 has a rough surface owing to the ionized clusters having an excess amount of energy. Therefore, a desirable accelerating voltage is in the range from 3 to 7 kV.

(B) Rate of Film Formation and Degree of Vacuum

The rate of film formation interrelates with the degree of vacuum, namely, the higher the degree of vacuum, the lower the rate of film formation, and the lower the degree of vacuum, the higher the rate of film formation. The reason for this can be accounted for by the ratio of the amount of Au atoms reaching the substrate 2 at the time of film formation to the amount of residual gas which becomes an impurity upon entrance into the film. In the case of a mirror for electromagnetic radiation of short wavelengths which needs to meet stringent specifications, it is necessary to control the impurity level below 1%. If the degree of vacuum is $10^{-8}$ Torr, as much residual gas as sufficient to form 0.01 atomic layer per second reaches the substrate. To minimize the effect of residual gas (impurity), it is necessary that as much Au as sufficient to form a 1-atom layer per second reach the substrate. In other words, the rate of film formation should be greater than 5 Å/s (or 1-atom layer per second). The degree of vacuum should preferably be lower than $1 \times 10^{-7}$ Torr. A vacuum higher than $1 \times 10^{-7}$ Torr is not desirable because residual gas in the vicinity of the cluster ion source is ionized and accelerated to reach the substrate 2, resulting in an increased ratio of impurity in the Au film 3. This is what should be avoided in the case of a mirror (as in the present invention) which needs a high degree of flatness. Therefore, according to the present invention, the rate of film formation (R Å/s) and the degree of vacuum (P Torr) should be in the range defined by the following equations.

$$R/P \geq 5 \times 10^8$$

$$P \leq 1 \times 10^{31\ 7} \text{ Torr}$$

In other words, according to the present invention, the rate of film formation (R) should be in the range of 0.5 to 5 Å/s and the degree of vacuum (P) should be lower than $1 \times 10^{-7}$ Torr.

(C) Substrate Temperature

If the substrate 2 is heated unnecessarily high, the Au film formed thereon has a rough surface due to recrystallization. Especially, with a substrate temperature higher than 60° C., the surface roughness exceeds 5 Å. Therefore, according to the present invention, the substrate temperature should be in the range of 0° C. to 60° C. (It is practically difficult to lower the substrate temperature below 0° C., although such a low temperature is permissible.)

(D) Film Thickness

With a thickness smaller than 50 Å, the Au film 3 is liable to be discontinuous and hence decreases in the effective area for light reflection. With a thickness greater than 1000 Å, the Au film 3 is liable to have a less smooth surface. In an extreme case, the surface of the Au film 3 is rougher than the surface of the substrate 2. Experimental results indicate that the maximum reflectivity is obtained when the film thickness is 230 Å. Therefore, according to the present invention, the film thickness should be in the range of 50 Å to 1000 Å.

It is concluded from the above-foregoing (A) to (D) that the method of the present invention should preferably be carried out under the conditions that the accelerating voltage is 3–7 kV, the rate of film formation (R Å/s) and the degree of vacuum (P Torr are defined by $R/P \geq 5 \times 10^8$ and $\leq 1 \times 10^{-7}$ Torr, the substrate temperature is 0°–60° C., and the film thickness is 50–1000 Å. The Au film formed under these conditions invariably has better surface smoothness than the substrate and produces a high reflectivity.

Figure 5:
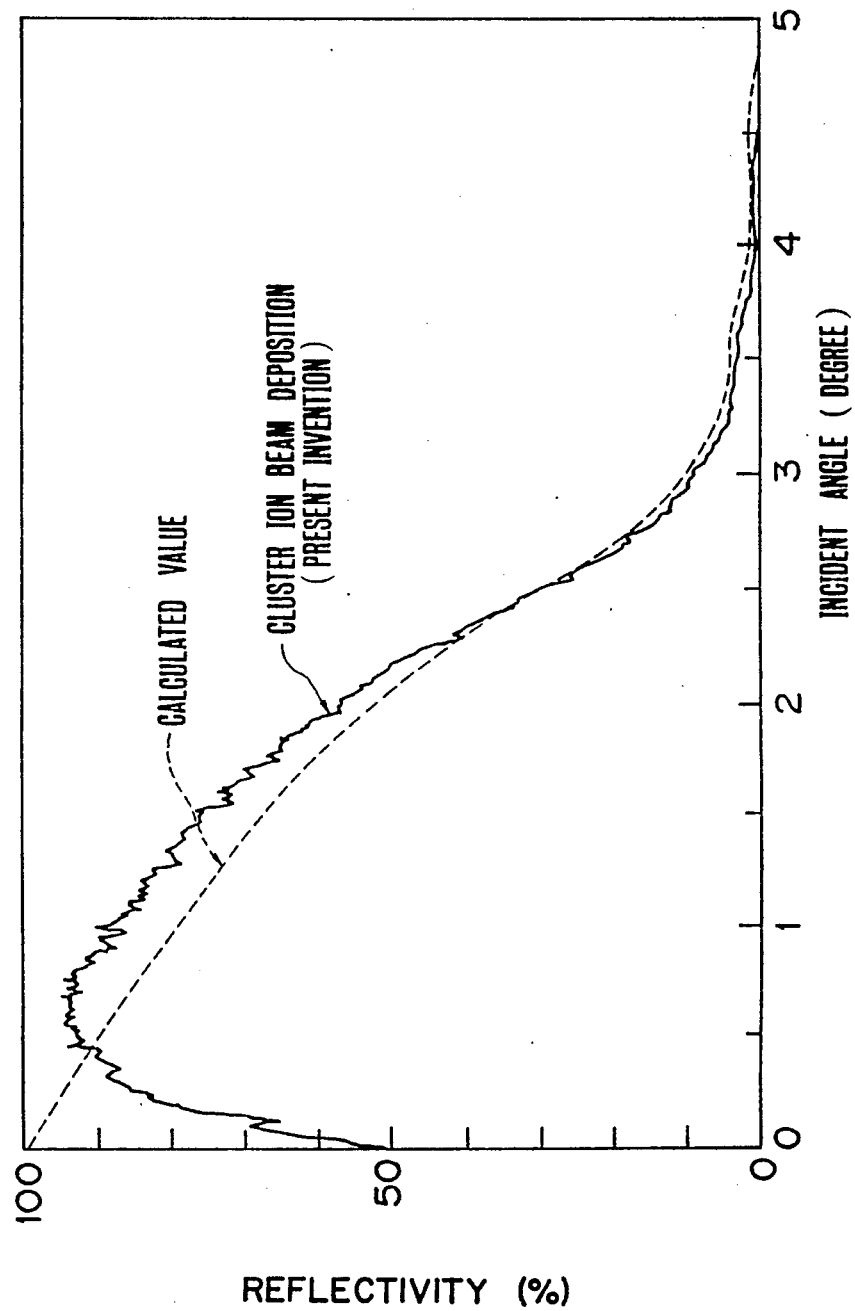
FIG. 5 is a graph showing the reflectivity of mirrors produced by the method of the present invention and the conventional method.

In an embodiment, an Au film, 230 Å thick, was formed by vacuum deposition on a substrate I under the conditions that the accelerating voltage is 3 kV, the rate of film formation is 0.5 Å/s, the degree of vacuum is $1 \times 10^{-9}$ Torr, and the substrate temperature is 25° C. This Au film has a reflectivity for X-rays having a wavelength of 8 Å which varies depending on the incident angle, as shown in FIG. 5. (The solid line represents the experimental results, and the dotted line represents the theoretical values calculated from the optical constants of Au in bulk. The theoretical value corresponds to the maximum reflectivity that could be achieved by the conventional method.) It is noted from FIG. 5 that the mirror pertaining to the present invention has a reflectivity much higher than the theoretical one of the conventional mirror. Incidentally, it was impossible to measure the reflectivity at incident angles of 0°–0.5° because of the geometrical limitations of the measuring apparatus.

As mentioned above, according to the method of the present invention, an Au film 50–1000 Å thick is formed on a substrate having a surface roughness smaller than 5 Å by vacuum deposition of metal clusters under the conditions that the accelerating voltage is 3–7 kV, the rate of film formation (R Å/s) and the degree of vacuum (P Torr are defined by $R/P \geq 5 \times 10^8$ and $P \leq 1 \times 10^{-7}$ Torr, the substrate temperature is 0°–60° C., and the film thickness is 50–1000 Å. The Au film formed under these conditions invariably has better surface smoothness than the substrate and produces a high reflectivity which has never been achieved by the conventional method.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of making a mirror for electromagnetic radiations of short wavelengths using a cluster ion beam vacuum deposition apparatus, the method comprising forming a film on a substrate having a surface roughness smaller than 5 Å by bombardment with a noble metal, which is at least partly in the form of cluster ions, in a vacuum chamber under the conditions that an accelerating voltage applied to an accelerating electrode is of 3-7 kv, a temperature of the substrate is kept at 0°-60° C., a pressure in the vacuum chamber is kept below $1 \times 10^{-7}$ Torr, and the film is formed at a rage of 0.5–5 Å/s to be 50–1000 Å thick and of adhesion strength greater than 430 kg/cm$^2$.

2. The method of making a mirror for electromagnetic radiations of short wavelengths according to claim 1, the noble metal being gold.

3. The method of making a mirror for electromagnetic radiations of short wavelengths according to claim 2, the film being formed at a rate of 0.5 Å/s to be 230 Å thick with the accelerating voltage being 3 kv, the temperature of the substrate being 25° C. and the pressure in the vacuum chamber being $1 \times 10^{-9}$ Torr.

4. A method of depositing a noble metal film on a glass substrate using a cluster ion beam vacuum deposition apparatus, the noble metal being contained within a crucible having a small hole through an upper surface thereof, the deposited noble metal film having an adhesion strength greater than 430 kg/cm$^2$, the method comprising the steps of:

evacuating the cluster ion beam vacuum deposition apparatus to maintain a pressure therein less than $1 \times 10^{-7}$ Torr;

heating the crucible to create noble metal vapor within the crucible, the noble metal vapor being emitted therefrom as vapor pressure within the crucible increases and forming clusters due to adiabatic expansion;

ionizing the clusters with an electron shower generated by an electron source;

heating the glass substrate to a temperature within the range of 0°–60° C; and accelerating the ionized clusters, with accelerating electrodes, to strike the heated glass substrate, an accelerating voltage within a range of 3–7 kv being applied to the accelerating electrodes, the noble metal film being formed at a rate within a range of 0.5–5 Å/s to be 50–1000 Å thick.

5. The method of depositing a noble metal film on a glass substrate according to claim 4, the noble metal being gold.

6. The method of depositing a noble metal film on a glass substrate according to claim 5, the noble metal film being formed at a rate of 0.5 Å/s to be 230 Å thick with the accelerating voltage being 3 kv, the temperature of the glass substrate being 25° C. and the pressure in the cluster ion beam vacuum deposition apparatus being $1 \times 10^{-9}$ Torr.

7. A method of making a mirror by forming a gold film on a glass substrate using a cluster ion beam vacuum deposition apparatus, comprising the steps of:

evacuating the cluster ion beam vacuum deposition apparatus to maintain a pressure therein of $1 \times 10^{-9}$ Torr;

heating gold within a crucible having a small hole to create gold vapor, the gold vapor being emitted therefrom to form clusters;

ionizing the clusters with an electron shower generated by an electron source;

heating the glass substrate to 25° C; and accelerating the ionized clusters, with accelerating electrodes, to strike the heated glass substrate, an accelerating voltage of 3 kv being applied to the accelerating electrodes, the gold film being formed at a rate of 0.5 Å/s to be 230 Å thick with a surface roughness of 5 Å and an adhesion strength greater than 430 kg/cm$^2$.

* * * * *